(12) United States Patent
Kuramoto

(10) Patent No.: US 8,692,975 B2
(45) Date of Patent: Apr. 8, 2014

(54) MEASUREMENT APPARATUS, EXPOSURE APPARATUS, AND DEVICE FABRICATION METHOD

(75) Inventor: Yoshiyuki Kuramoto, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 583 days.

(21) Appl. No.: 12/941,368

(22) Filed: Nov. 8, 2010

(65) Prior Publication Data

US 2011/0134408 A1    Jun. 9, 2011

(30) Foreign Application Priority Data

Dec. 9, 2009    (JP) ................................. 2009-279812

(51) Int. Cl.
*G03B 27/42*    (2006.01)

(52) U.S. Cl.
USPC .................................. 355/53; 355/55; 355/77

(58) Field of Classification Search
USPC ........ 355/53, 55, 77; 356/121, 124–127, 601, 356/625, 618; 430/5, 311, 313, 394
See application file for complete search history.

(56) References Cited

U.S. PATENT DOCUMENTS

| 6,816,247 | B1 | 11/2004 | Heppner et al. |
| 2009/0066925 | A1 | 3/2009 | Ohsaki et al. |
| 2009/0219494 | A1 | 9/2009 | Kakuchi |

FOREIGN PATENT DOCUMENTS

| KR | 10-2009-0027175 A | 3/2009 |
| KR | 10-2009-0094768 A | 9/2009 |

OTHER PUBLICATIONS

KR OA issued Jun. 19, 2013 for corres. KR 10-2010-0121413.

*Primary Examiner* — Steven H Whitesell Gordon
*Assistant Examiner* — Mesfin T Asfaw
(74) *Attorney, Agent, or Firm* — Rossi, Kimms & McDowell LLP

(57) ABSTRACT

The present invention provides a measurement apparatus which measures an imaging performance of an optical system to be measured, the apparatus including a first reference substrate which is placed on an object plane of the optical system to be measured, and has periodic patterns arranged in accordance with a plurality of object heights, a second reference substrate which is placed on an image plane of the optical system to be measured, and has apertures which pass light from the periodic patterns, a detection unit configured to detect an intensity of the light which comes from the periodic patterns and has passed through the apertures, a driving unit configured to drive at least one of the first reference substrate and the second reference substrate, and a processing unit configured to perform a process for obtaining the imaging performance of the optical system to be measured.

7 Claims, 10 Drawing Sheets the present invention.

MEASUREMENT APPARATUS, EXPOSURE APPARATUS, AND DEVICE FABRICATION METHOD

BACKGROUND OF THE INVENTION

1. Field of the Invention

The present invention relates to a measurement apparatus, an exposure apparatus, and a device fabrication method.

2. Description of the Related Art

An exposure apparatus is employed to fabricate semiconductor devices using photolithography. The exposure apparatus projects and transfers a pattern formed on a reticle (mask) onto a substrate such as a wafer by a projection optical system. In recent years, as semiconductor devices are further miniaturized, the exposure apparatus must precisely transfer the pattern of a reticle onto a wafer at a predetermined magnification. Hence, the imaging performance of the projection optical system must be measured with high accuracy. To meet this requirement, U.S. Pat. No. 6,816,247, for example, proposes a technique for measuring the distortion of the projection optical system.

However, since the projection optical system to be measured has various imaging performances such as a curvature of field, distortion, and wavefront aberrations. It has recently been demanded to develop a new technique which can measure, among others, the curvature of field of the projection optical system.

SUMMARY OF THE INVENTION

The present invention provides a technique which can measure the imaging performance, including the curvature of field, of an optical system to be measured.

According to one aspect of the present invention, there is provided a measurement apparatus which measures an imaging performance of an optical system to be measured, the apparatus including a first reference substrate which is placed on an object plane of the optical system to be measured, and has periodic patterns arranged in accordance with a plurality of object heights, a second reference substrate which is placed on an image plane of the optical system to be measured, and has apertures which pass light from the periodic patterns, a detection unit configured to detect an intensity of the light which comes from the periodic patterns and has passed through the apertures, a driving unit configured to drive at least one of the first reference substrate and the second reference substrate, and a processing unit configured to perform a process for obtaining the imaging performance of the optical system to be measured, wherein the processing unit obtains, for each of a plurality of image heights corresponding to the plurality of object heights, a phase difference between two light beams, which are diffracted by the periodic pattern and pass through two positions on a pupil plane of the optical system to be measured, from a change in the intensity of the light from the periodic patterns, which is detected by the detection unit upon driving at least one of the first reference substrate and the second reference substrate in a direction perpendicular to an optical axis of the optical system to be measured by the driving unit, under a first diffraction condition in which the two diffracted light beams are generated, obtains, for each of the plurality of image heights corresponding to the plurality of object heights, a phase difference between two light beams, which are diffracted by the periodic pattern and pass through two positions on the pupil plane, from a change in the intensity of the light from the periodic patterns, which is detected by the detection unit upon driving at least one of the first reference substrate and the second reference substrate in the direction perpendicular to the optical axis by the driving unit, under a second diffraction condition in which the two diffracted light beams are generated and a position where at least one of the two diffracted light beams is incident on the pupil plane is different from positions where the two light beams diffracted by the periodic pattern are incident on the pupil plane under the first diffraction condition, and obtains an imaging performance, including a curvature of field, of the optical system to be measured, based on the phase difference between the two diffracted light beams and the positions where the two diffracted light beams are incident on the pupil plane at each of the plurality of image heights under the first diffraction condition, and the phase difference between the two diffracted light beams and the positions where the two diffracted light beams are incident on the pupil plane at each of the plurality of image heights under the second diffraction condition.

Further features of the present invention will become apparent from the following description of exemplary embodiments with reference to the attached drawings.

DESCRIPTION OF THE EMBODIMENTS

Figure 1:
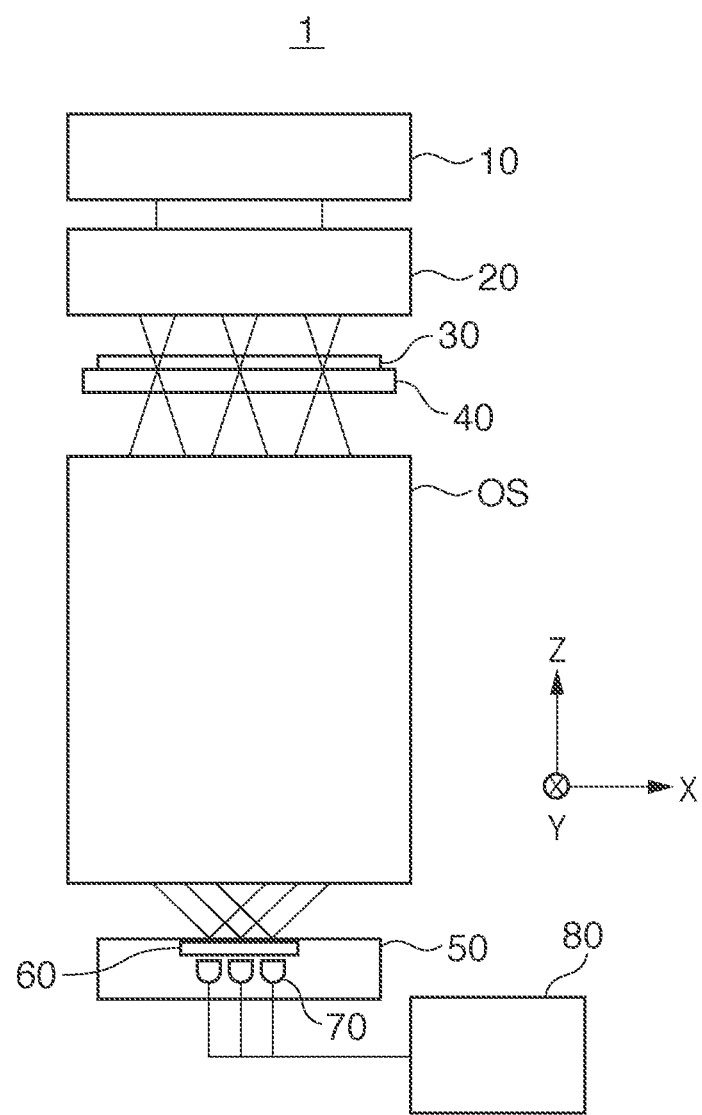
FIG. 1 is a schematic diagram showing the configuration of a measurement apparatus according to the first embodiment of the present invention.

Preferred embodiments of the present invention will be described below with reference to the accompanying drawings. Note that the same reference numerals denote the same members throughout the drawings, and a repetitive description thereof will not be given.

<First Embodiment>

FIG. 1 is a schematic diagram showing the configuration of a measurement apparatus 1 according to the first embodiment of the present invention. The measurement apparatus 1 can measure a plurality of imaging performances (for example, the distortion and curvature of field) of an optical system to be measured OS. Although a projection optical system used in an exposure apparatus is assumed as the optical system to be measured OS in this embodiment, the present invention is not limited to this, and the optical system to be measured OS includes various types of optical systems such as an illumination optical system.

The measurement apparatus 1 includes a light source 10, illumination optical system 20, first reference substrate 30, first stage 40, second stage 50, second reference substrate 60, detection unit 70, and processing unit 80, as shown in FIG. 1.

Light emitted by the light source 10 illuminates the first reference substrate 30 under an appropriate illumination condition (illumination mode) via the illumination optical system 20. The first reference substrate 30 is supported (fixed) by the first stage 40, and placed on the object plane of the optical system to be measured OS. The first stage 40 can drive the first reference substrate 30 in a direction perpendicular to the optical axis of the optical system to be measured OS.

Figure 2:
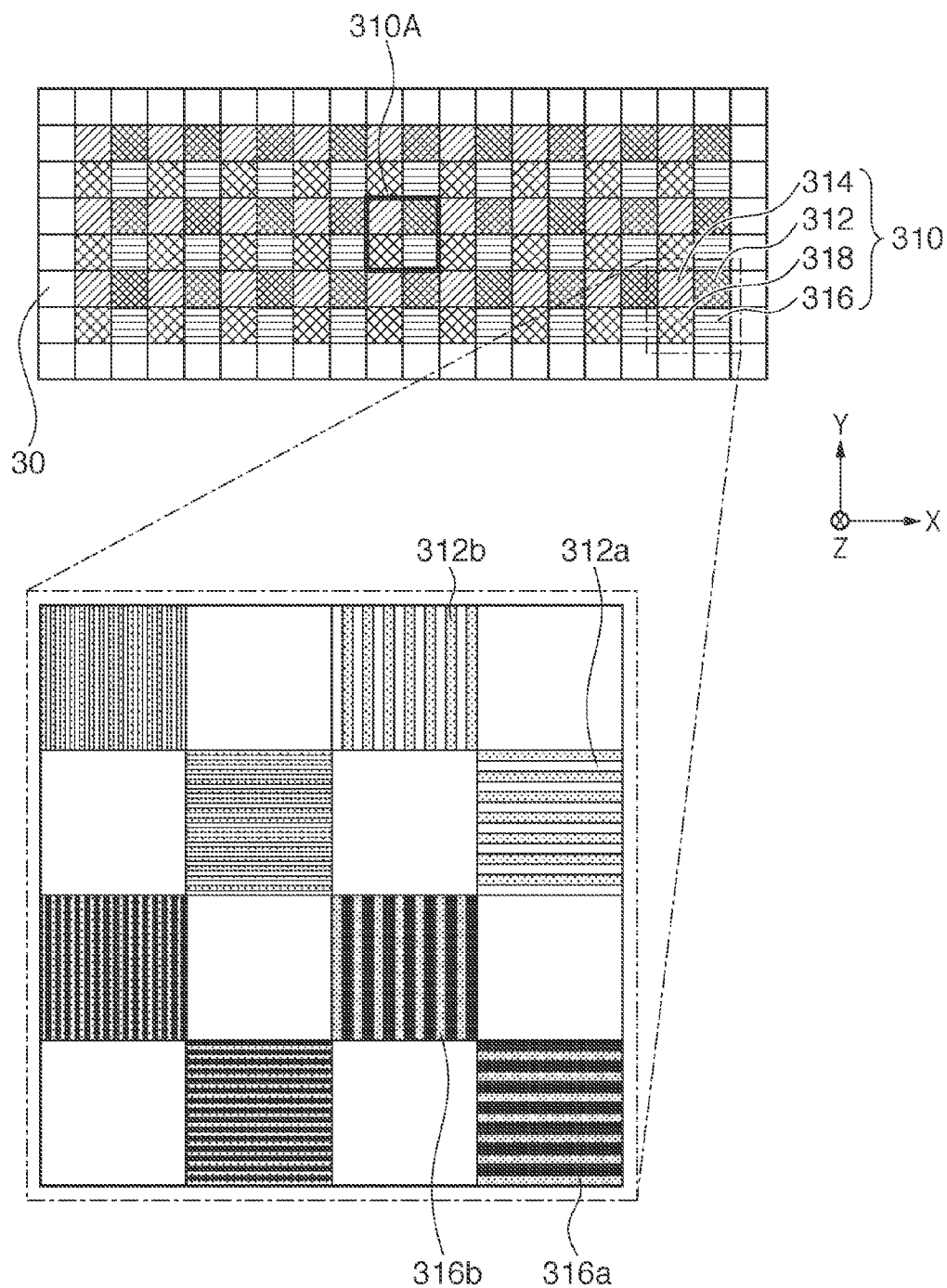
FIG. 2 is a view showing the arrangement of a first reference substrate of the measurement apparatus shown in FIG. 1.

FIG. 2 is a view showing the arrangement of the first reference substrate 30. The first reference substrate 30 has periodic patterns 310 each including first periodic patterns 312 and 314 and second periodic patterns 316 and 318, as shown in FIG. 2. Note that the first periodic patterns 312 and 314 have different line widths, and the second periodic patterns 316 and 318 also have different line widths. The periodic patterns 310 are arranged in accordance with a plurality of object heights so as to extend over the entire measurement region for the imaging performances of the optical system to be measured OS. Also, referring to FIG. 2, a periodic pattern 310A is positioned at the field center, which is assumed as a reference position in this embodiment.

The first reference substrate 30 has a plurality of periodic patterns for the following two purposes: first, to generate different diffracted light beams necessary to measure the distortion and curvature of field of the optical system to be measured OS and, second, to measure the imaging performances (distortions and curvatures of field) using a plurality of patterns with different line widths in consideration of the influence of wavefront aberrations remaining in the optical system to be measured OS. The second purpose need not be achieved if the influence of the aberrations of the optical system to be measured OS is negligible.

Referring to FIG. 2, the first periodic pattern 312 includes a Y-axis direction pattern 312a and X-axis direction pattern 312b in order to generate diffracted light beams in both the X- and Y-axis directions, respectively. Also, the second periodic pattern 316 includes a Y-axis direction pattern 316a and X-axis direction pattern 316b. Each of the first periodic pattern 314 and second periodic pattern 318 also includes a Y-axis direction pattern and X-axis direction pattern, like the first periodic pattern 312 and second periodic pattern 316.

Light beams diffracted by the first periodic pattern 312 (first periodic pattern 314) and the second periodic pattern 316 (second periodic pattern 318) must satisfy the following first and second conditions. The first condition is that each of the first periodic pattern 312 and the second periodic pattern 316 generates two diffracted light beams which pass through two positions on the pupil plane of the optical system to be measured OS. This is because an aerial image formed by two-beam interference has the property that its contrast stays constant regardless of defocusing, so the first condition is suitable when an aerial image is detected within the full field at once in the optical system to be measured OS having a curvature of field. Note that in practice, the illumination optical system 20 has a finite coherence factor σ and the contrast of the aerial image decreases upon defocusing, but nonetheless its influence can be made smaller in two-beam interference than in three-beam interference formed by a binary pattern. The second condition is that the position where at least one of two light beams diffracted by the second periodic pattern 316 is incident on the pupil plane of the optical system to be measured OS is different from those where two light beams diffracted by the first periodic pattern 312 are incident on the pupil plane of the optical system to be measured OS. This is necessary to obtain the tilt and defocus in the diffraction direction from the phase differences each between two diffracted light beams, which are obtained using the first periodic pattern 312 and second periodic pattern 316.

In the measurement apparatus 1 according to this embodiment, the above-mentioned two conditions (diffraction conditions) are of prime importance, so the periodic pattern 310 and the illumination condition of the illumination optical system 20 need only be set so as to satisfy these conditions.

Figure 3:
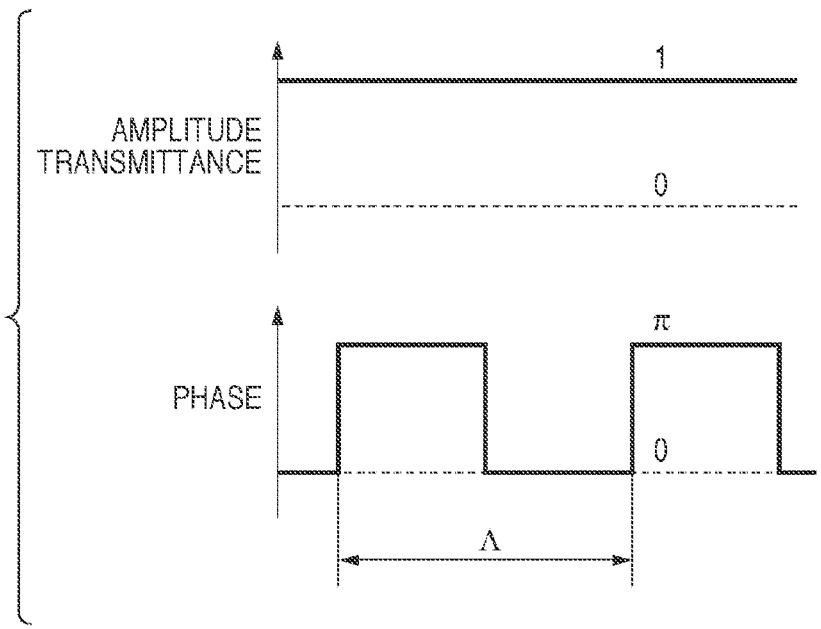
FIG. 3 is a chart for explaining a first periodic pattern of the first reference substrate shown in FIG. 2.

The periodic patterns 310 and the illumination condition of the illumination optical system 20 will be described in detail. A periodic pattern of a phase type with a constant amplitude transmittance and a phase of 0 or π, as shown in FIG. 3, is used as the first periodic pattern 312 (first periodic pattern 314). Upon illuminating the first periodic pattern 312 as in this case under a normal illumination condition, ±1st-order diffracted light beams symmetrical about the pupil center of the optical system to be measured OS are generated. Also, a periodic pattern which generates 0th- and +1st-order diffracted light beams is used as the second periodic pattern 316 (second periodic pattern 318). An ideal periodic pattern which generates only 0th- and +1st-order diffracted light beams in the X-axis direction has a complex amplitude transmittance a(x) given by:

$$a(x) = \exp\left(2\pi i \frac{x}{\Lambda}\right) \cos\left(2\pi \frac{x}{\Lambda}\right) \tag{1}$$

where Λ is the pattern period.

Figure 4:
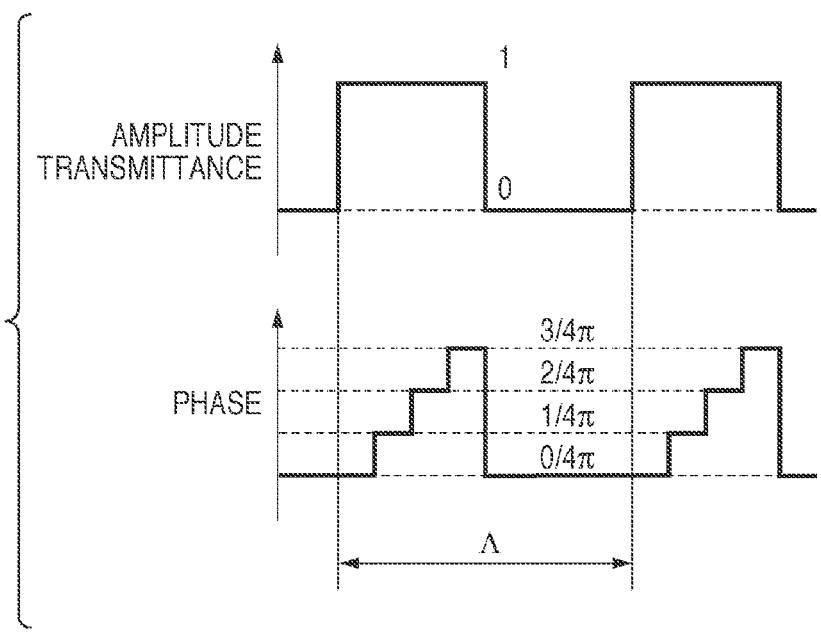
FIG. 4 is a chart for explaining a second periodic pattern of the first reference substrate shown in FIG. 2.

Equation (1) corresponds to a complex amplitude transmittance in which the phase changes at the same period as the amplitude. Hence, a periodic pattern of a phase-amplitude modulation type with its amplitude transmittance which takes binary values and its phase which changes between 0 and π for each half period of a change in amplitude transmittance is used as the second periodic pattern 316, as shown in FIG. 4, upon approximating equation (1). In this embodiment, the second periodic pattern 316 has a structure which shifts in four phases from 0 to ¾π in steps of π/4.

Light (diffracted light) diffracted by the first reference substrate 30 (periodic pattern 310) is projected to the image plane side of the optical system to be measured OS by the optical system to be measured OS, and enters the second reference substrate 60. The second reference substrate 60 is supported (fixed) by the second stage 50, and placed on the image plane of the optical system to be measured OS. The second stage 50 can drive the second reference substrate 60 and the detection unit 70 (to be described later) in a direction perpendicular to the optical axis of the optical system to be measured OS.

Figure 5:
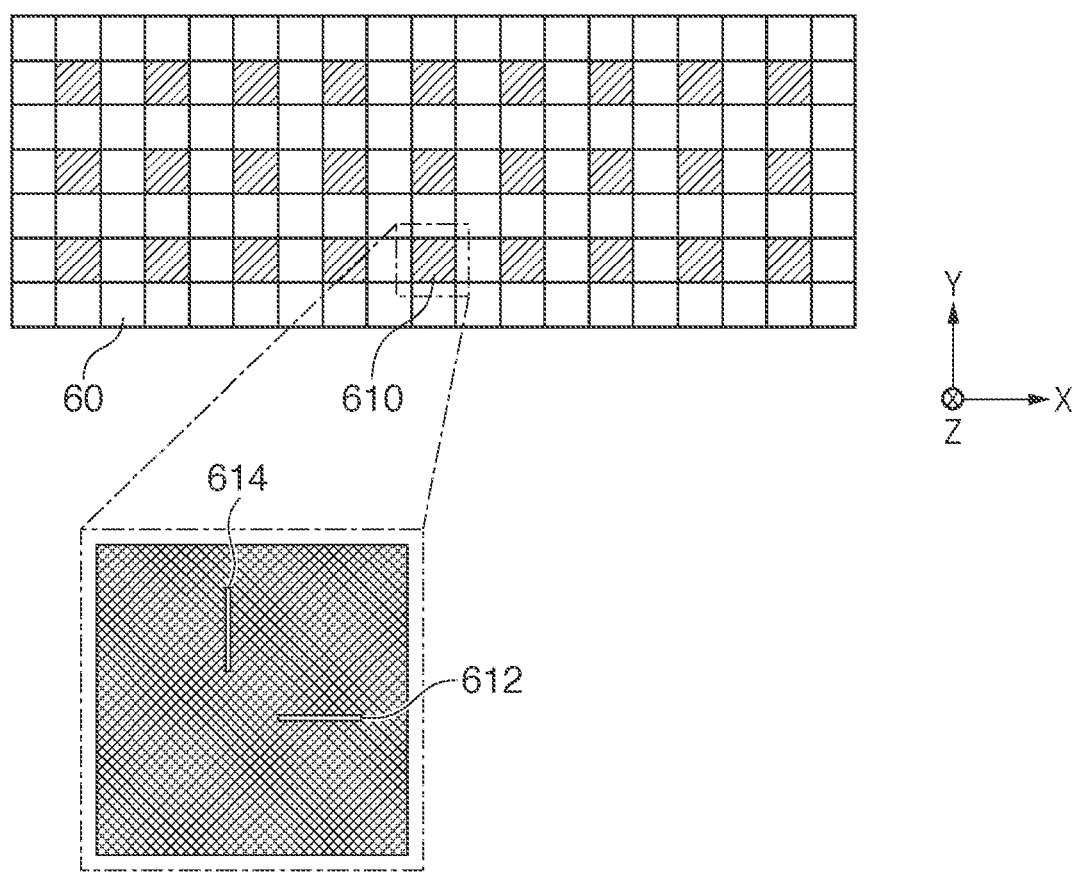
FIG. 5 is a view showing the arrangement of a second reference substrate of the measurement apparatus shown in FIG. 1.

FIG. 5 is a view showing the arrangement of the second reference substrate 60. The second reference substrate 60 has aperture patterns 610 at positions which correspond to the coordinate positions of the periodic patterns 310 of the first reference substrate 30, and where the periodic patterns 310 are reduced at the imaging magnification of the optical system to be measured OS (that is, at a plurality of image heights corresponding to a plurality of object heights), as shown in FIG. 5. In this embodiment, the aperture pattern 610 is an isolated aperture pattern, which has dimensions smaller than an image obtained by projecting the periodic pattern 310 of the first reference substrate 30 onto the image plane of the optical system to be measured OS. Also, the aperture pattern 610 includes an X-axis direction pattern aperture 612 and Y-axis direction pattern aperture 614 in correspondence with the X-axis direction pattern and Y-axis direction pattern, respectively, of each of the first periodic patterns 312 and 314 and second periodic patterns 316 and 318. Note that the aperture pattern 610 is not limited to an isolated aperture pattern, and may be a periodic aperture pattern in which a plurality of isolated aperture patterns are arrayed. If the aperture pattern 610 is a periodic aperture pattern, this pattern must be changed in accordance with the period of the periodic pattern 310 of the first reference substrate 30, but nonetheless is advantageous in amount (amount of transmitted light) of light transmitted through the aperture pattern 610.

In this embodiment, the detection unit 70 includes a plurality of photodetectors arranged in accordance with the aperture patterns 610 of the second reference substrate 60, and detects the amount of light (diffracted light) which comes from the periodic patterns 310 of the first reference substrate 30 and is transmitted through the aperture patterns 610. However, the detection unit 70 can be formed using a relay lens and an image sensor to detect, at once, the intensities of light beams which come from the periodic patterns 310 and are transmitted through the aperture patterns 610, respectively. The intensities of light beams (light amount data) from the periodic patterns 310, which are detected by the detection unit 70, are input to the processing unit 80. The second reference substrate 60 and detection unit 70 are fixed on the second stage 50, and can be driven in a direction perpendicular to the optical axis of the optical system to be measured OS, as described earlier.

The processing unit 80 performs a process for obtaining the imaging performances of the optical system to be measured OS while controlling the first stage 40 and second stage 50 each of which functions as a driving unit which drives at least one of the first reference substrate 30 and the second reference substrate 60 in a direction perpendicular to the optical axis of the optical system to be measured OS. In this embodiment, the processing unit 80 performs a process for obtaining the distortion and curvature of field of the optical system to be measured OS.

Figure 6:
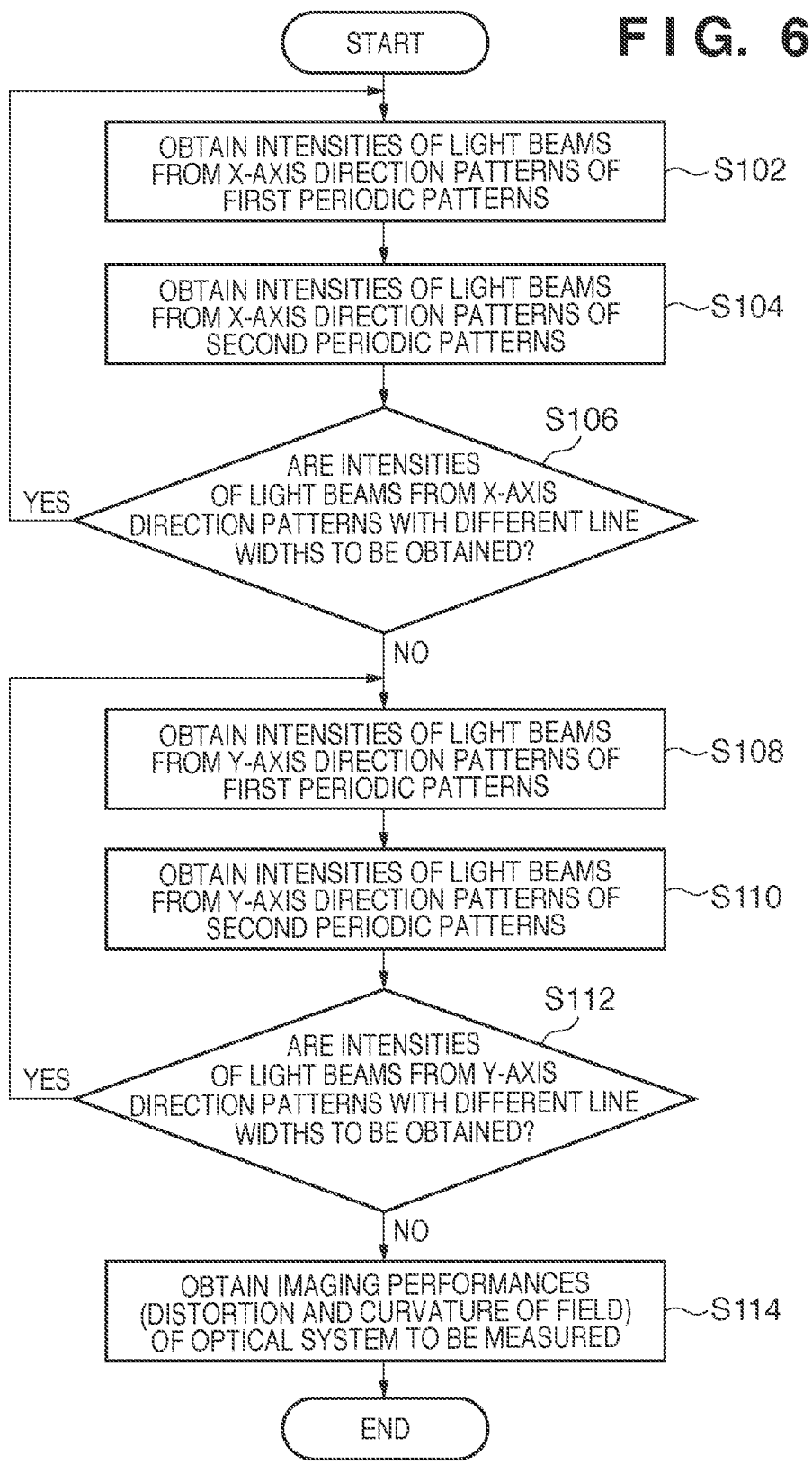
FIG. 6 is a flowchart for explaining measurement of the imaging performances (distortion and field of curvature) of an optical system to be measured by the measurement apparatus shown in FIG. 1.

Measurement of the imaging performances (distortion and curvature of field) of the optical system to be measured OS by the measurement apparatus 1 will be described below with reference to FIG. 6. This measurement is performed by systematically controlling each unit of the measurement apparatus 1 by the processing unit 80.

Figure 7:
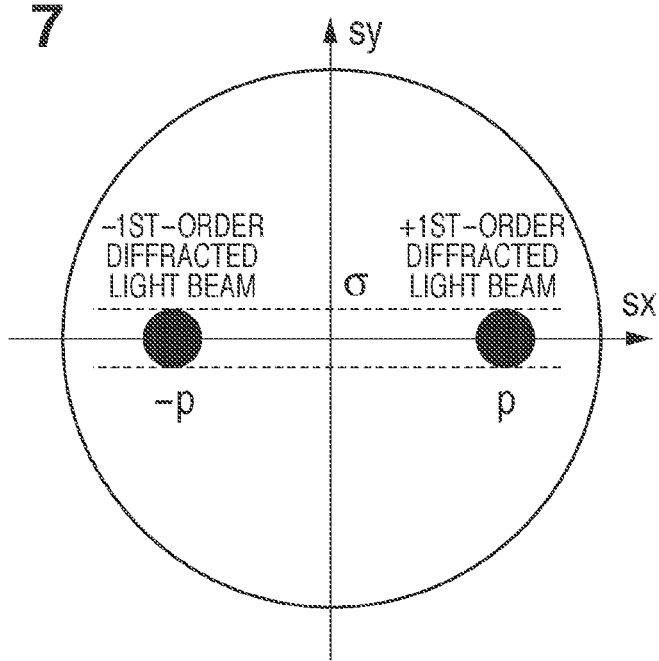
FIG. 7 is a graph showing the position where light beams diffracted by the periodic pattern of the first reference substrate are incident on the pupil plane of the optical system to be measured.

In step S102, the processing unit 80 obtains the intensities of light beams from the X-axis direction patterns 312b of the first periodic patterns 312, which are detected by the detection unit 70, while driving the second reference substrate 60 in a direction perpendicular to the optical axis of the optical system to be measured OS by the second stage 50. Upon illuminating the X-axis direction pattern 312b under a normal illumination condition which uses an effective light source with a coherence factor σ, two diffracted light beams (±1st-order diffracted light beams) which pass through two positions on the pupil plane of the optical system to be measured OS are generated by the X-axis direction pattern 312b, as shown in FIG. 7. Let $P_{x11}=(+p,0)$ be the incident position (central position) of the +1st-order diffracted light beam on the pupil plane of the optical system to be measured OS, and $P_{x12}=(-p,0)$ be the incident position (central position) of the −1st-order diffracted light beam on that pupil plane. The incident positions of the diffracted light beams on the pupil plane of the optical system to be measured OS can be obtained in advance from the characteristics of the periodic patterns 310 of the first reference substrate 30 and the illumination condition of the illumination optical system 20. The incident positions of the diffracted light beams can also be obtained actually using, for example, a measurement apparatus which measures the diffracted light beams.

A projected image (aerial image) of the X-axis direction pattern 312b has dimensions larger than those of the X-axis direction pattern aperture 612. Hence, projected images of the X-axis direction patterns 312b can be obtained by detecting the intensities of light beams from the X-axis direction patterns 312b by the detection unit 70 while driving the second stage 50 (second reference substrate 60) in a direction perpendicular to the optical axis of the optical system to be measured OS. More specifically, a projected image I(x) of the X-axis direction pattern 312b is described by:

$$I(x) = \int_S^\sigma \left\{1 + \cos\left(2\pi\left[W(P_{x11}+S) - W(P_{x12}+S) + \frac{2x}{\Lambda}\right]\right)\right\} dS \quad (2)$$

where Λ is the pattern period of the X-axis direction pattern 312b corresponding to the scale on the image plane, and x is the position of the second stage 50. Note that in equation (2), the integral is calculated within the range of an effective light source (within a circle with a radius σ).

Figure 8:
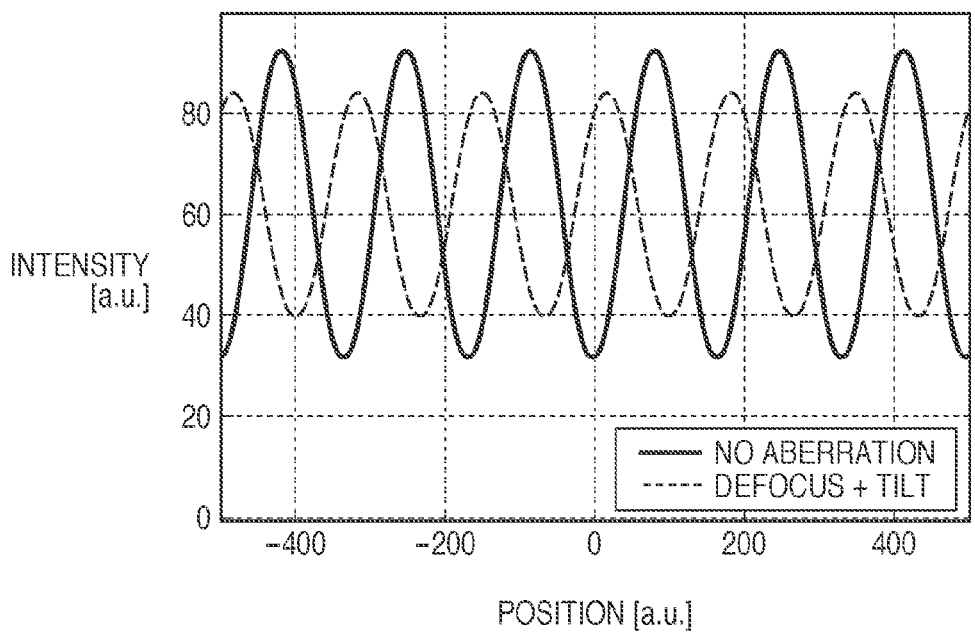
FIG. 8 is a graph showing the simulation result of a projected image of an X-axis direction pattern of the first periodic pattern.

FIG. 8 shows the simulation result of a projected image of the X-axis direction pattern 312b, which is obtained from equation (2). In FIG. 8, the ordinate indicates the intensity, and the abscissa indicates the position in the X-axis direction. Also in FIG. 8, a solid line shows a projected image when the optical system to be measured OS has no aberration, that is, has no distortion and curvature of field (the optical system to be measured OS is influenced by no image shift), and a broken line shows a projected image when the optical system to be measured OS has a distortion and curvature of field (the optical system to be measured OS is influenced by an image shift).

In practice, projected images of the X-axis direction patterns 312b are simultaneously detected at a plurality of image heights, respectively, and the amount of image shift, which differs for each image height, is detected by means of the distortion and curvature of field of the optical system to be measured OS. A phase $\phi_{x1}(X_i,Y_i)$ of a projected image of the X-axis direction pattern 312b, which is detected at an arbitrary image height $(X_i,Y_i)$, for the period Λ/2 is given by:

$$\phi_{x1}(X_i,Y_i) = W(P_{x11}) - W(P_{x12}) = W(p,0) - W(-p0) \quad (3)$$

The phase $\phi_{x1}(X_i,Y_i)$ is a phase difference between a +1st-order diffracted light beam and a −1st-order diffracted light beam. Note that the processing unit 80 obtains phases given by equation (3) for all image heights.

Figure 9:
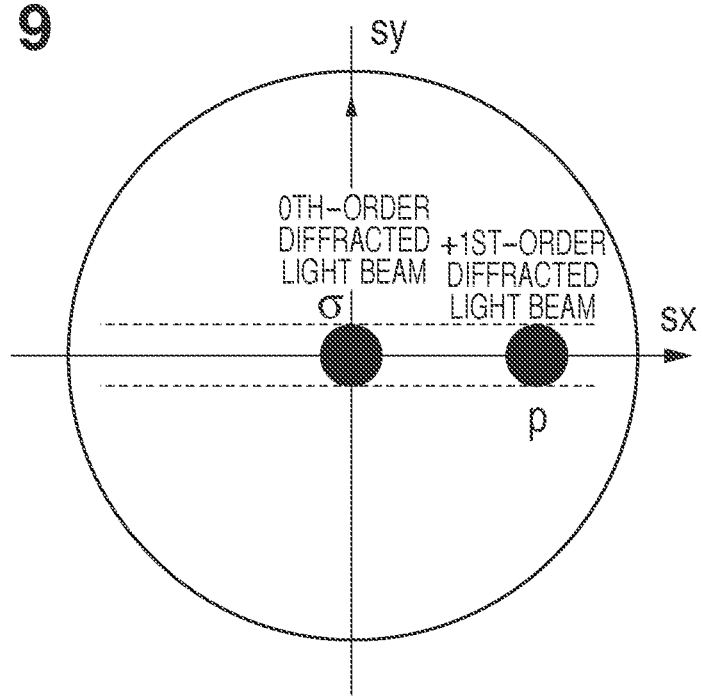
FIG. 9 is a graph showing the position where light beams diffracted by the periodic pattern of the first reference substrate are incident on the pupil plane of the optical system to be measured.

In step S104, the processing unit 80 obtains the intensities of light beams from the X-axis direction patterns 316b of the second periodic patterns 316, which are detected by the detection unit 70, while driving the second reference substrate 60 in a direction perpendicular to the optical axis of the optical system to be measured OS by the second stage 50. Upon illuminating the X-axis direction pattern 316b under a normal illumination condition which uses an effective light source with a coherence factor σ, two diffracted light beams (0th- and +1st-order diffracted light beams) which pass through two positions on the pupil plane of the optical system to be measured OS are generated by the X-axis direction pattern 316b, as shown in FIG. 9. Let $P_{x21}=(+p,0)$ be the incident position (central position) of the +1st-order diffracted light beam on the pupil plane of the optical system to be measured OS, and $P_{x22}=(0,0)$ be the incident position (central position) of the 0th-order diffracted light beam on that pupil plane. A projected image I(x) of the X-axis direction pattern 316b is described by:

$$I(x) = \int_S^\sigma \left\{ 1 + \cos\left(2\pi\left[W(P_{x21} + S) - W(P_{x22} + S) + \frac{2x}{\Lambda}\right]\right)\right\} dS \quad (4)$$

where Λ is the pattern period of the X-axis direction pattern 316b corresponding to the scale on the image plane, and x is the position of the second stage 50.

Figure 10:
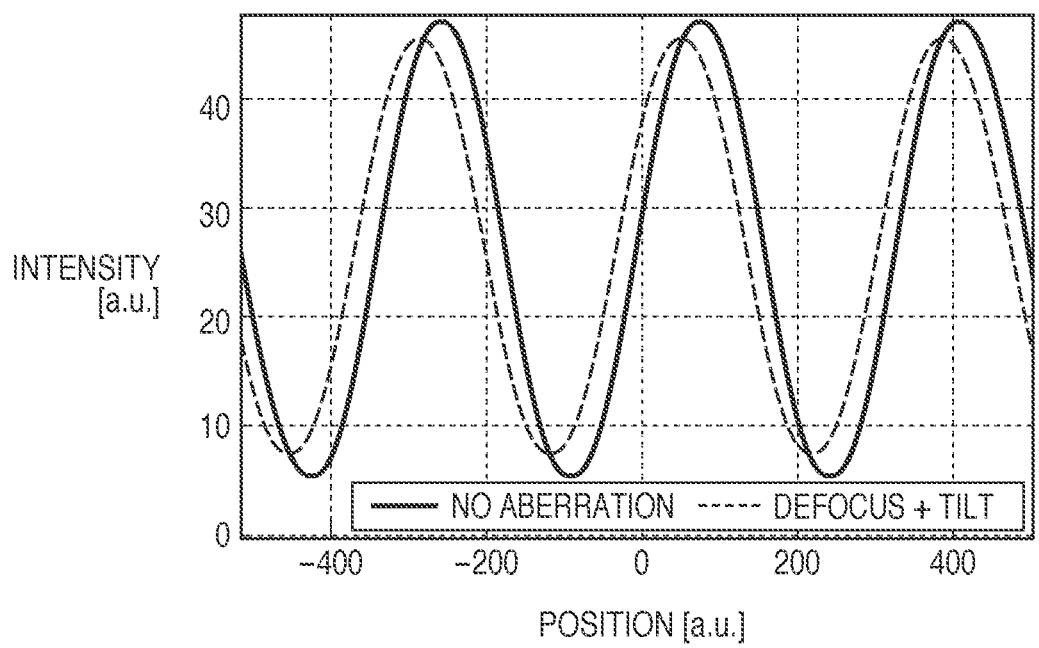
FIG. 10 is a graph showing the simulation result of a projected image of an X-axis direction pattern of the second periodic pattern.

FIG. 10 shows the simulation result of a projected image of the X-axis direction pattern 316b, which is obtained from equation (4). In FIG. 10, the ordinate indicates the intensity, and the abscissa indicates the position in the X-axis direction. Also in FIG. 10, a solid line shows a projected image when the optical system to be measured OS has no aberration, that is, has no distortion and curvature of field (the optical system to be measured OS is influenced by no image shift), and a broken line shows a projected image when the optical system to be measured OS has a distortion and curvature of field (the optical system to be measured OS is influenced by an image shift). Note that in both the simulation results shown in FIGS. 8 and 10, the amounts of distortion and curvature of field of the optical system to be measured OS are the same.

A phase $\phi_{x2}(X_i,Y_i)$ of a projected image of the X-axis direction pattern 316b, which is detected at an arbitrary image height $(X_i,Y_i)$, for the period Λ is given by:

$$\phi_{x2}(X_i,Y_i)=W(P_{x21})-W(P_{x22})=W(+p,0)-W(0,0) \quad (5)$$

The phase $\phi_{x2}(X_i,Y_i)$ is a phase difference between a 0th-order diffracted light beam and +1st-order diffracted light beam. Note that the processing unit 80 obtains phases given by equation (5) for all image heights.

In step S106, it is determined whether to obtain the intensities of light beams from X-axis direction patterns with different line widths (the X-axis direction patterns of the first periodic pattern 314 and second periodic pattern 318 in this embodiment) using the X-axis direction patterns. If it is determined that the intensities of light beams from the X-axis direction patterns with different line widths are to be obtained, the process returns to step S102; otherwise, the process advances to step S108.

In step S108, the processing unit 80 obtains the intensities of light beams from the Y-axis direction patterns 312a of the first periodic patterns 312, which are detected by the detection unit 70, while driving the second reference substrate 60 in a direction perpendicular to the optical axis of the optical system to be measured OS by the second stage 50. Upon illuminating the Y-axis direction pattern 312a under a normal illumination condition which uses an effective light source with a coherence factor σ, two diffracted light beams (0th- and +1st-order diffracted light beams) which pass through two positions on the pupil plane of the optical system to be measured OS are generated by the Y-axis direction pattern 312a. Let $P_{y11}=(0,+p)$ be the incident position (central position) of the +1st-order diffracted light beam on the pupil plane of the optical system to be measured OS, and $P_{y12}=(0,-p)$ be the incident position (central position) of the −1st-order diffracted light beam on that pupil plane. A phase $\phi_{y1}(X_i,Y_i)$ of a projected image of the Y-axis direction pattern 312a, which is detected at an arbitrary image height $(X_i,Y_i)$, is given by:

$$\phi_{y1}(X_i,Y_i)=W(S_{y11})-W(S_{y12})=W(0,+p)-W(0,-p) \quad (6)$$

Note that the processing unit 80 obtains phases given by equation (6) for all image heights.

In step S110, the processing unit 80 obtains the intensities of light beams from the Y-axis direction patterns 316a of the second periodic patterns 316, which are detected by the detection unit 70, while driving the second reference substrate 60 in a direction perpendicular to the optical axis of the optical system to be measured OS by the second stage 50. Upon illuminating the Y-axis direction pattern 316a under a normal illumination condition which uses an effective light source with a coherence factor σ, two diffracted light beams (0th- and +1st-order diffracted light beams) which pass through two positions on the pupil plane of the optical system to be measured OS are generated by the Y-axis direction pattern 316a. Let $P_{y21}=(0,+p)$ be the incident position (central position) of the +1st-order diffracted light beam on the pupil plane of the optical system to be measured OS, and $P_{y22}=(0,0)$ be the incident position (central position) of the 0th-order diffracted light beam on that pupil plane. A phase $\phi_{y2}(X_i,Y_i)$ of a projected image of the Y-axis direction pattern 316a, which is detected at an arbitrary image height $(X_i,Y_i)$, is given by:

$$\phi_{y2}(X_i,Y_i)=W(S_{y21})-W(S_{y22})=W(0,+p)-W(0,0) \quad (7)$$

Note that the processing unit 80 obtains phases given by equation (7) for all image heights.

In step S112, it is determined whether to obtain the intensities of light beams from Y-axis direction patterns with different line widths (the Y-axis direction patterns of the first periodic pattern 314 and second periodic pattern 318 in this embodiment) using the Y-axis direction patterns. If it is determined that the intensities of light beams from the Y-axis direction patterns with different line widths are to be obtained, the process returns to step S108; otherwise, the process advances to step S114.

In step S114, the processing unit 80 obtains the distortion and curvature of field of the optical system to be measured OS as the imaging performances of the optical system to be measured OS. Assuming that a wavefront aberration $W(s_x,s_y; X_i,Y_i)$ of the optical system to be measured OS at an arbitrary image height $(X_i,Y_i)$ includes the distortion and curvature of field of the optical system to be measured OS, it is given by:

$$W(s_x, s_y; X_i, Y_i) = \quad (8)$$
$$W_{tilt}(s_x, s_y; X_i, Y_i) + W_{def}(s_x, s_y; X_i, Y_i) = dX(X_i, Y_i)\frac{NA \cdot s_x}{\lambda} + dY(X_i, Y_i)\frac{NA \cdot s_y}{\lambda} + dZ(X_i, Y_i)\frac{1-\sqrt{1-NA^2(s_x^2+s_y^2)}}{2\lambda}$$

where $(s_x,s_y)$ are the pupil coordinates, $dX(X_i,Y_i)$, $dY(X_i,Y_i)$, $dZ(X_i,Y_i)$ are the amounts of distortions in the X- and Y-axis directions and curvature of field, respectively, at the image height $(X_i, Y_i)$, and NA is the numerical aperture of the optical system to be measured OS.

(p,0), (−p,0) and (0,0) is substituted for the pupil coordinates $(s_x, s_y)$, and from equations (3), (5), and (8), the amount of distortion in the X-axis direction $dX(X_i, Y_i)$ and the amount of field of curvature $dZ(X_i, Y_i)$ can be obtained in accordance with:

$$dX(X_i, Y_i) = \frac{\phi_{x1}(X_i, Y_i)}{2} \frac{\lambda}{NA \cdot p} \quad (9)$$

$$dZ(X_i, Y_i) = (2\phi_{x2}(X_i, Y_i) - \phi_{x1}(X_i, Y_i)) \frac{\lambda}{1 - \sqrt{1 - (NA \cdot p)^2}}$$

From equations (6) and (8), the amount of distortion in the Y-axis direction $dY(X_i, Y_i)$ can be similarly obtained in accordance with:

$$dY(X_i, Y_i) = \frac{\phi_{y1}(X_i, Y_i)}{2} \frac{\lambda}{NA \cdot p} \quad (10)$$

The amount $dZ(X_i, Y_i)$ is obtained again from equations (6) and (7) (that is, in the same way as in equations (9)), and the average of the amounts $dZ(X_i, Y_i)$ obtained from equations (6) and (7) and equation (9), respectively, is calculated. Thus, the curvature of field of the optical system to be measured OS can be calculated with high accuracy.

Also, if the intensities of light beams from a plurality of patterns (periodic patterns) with different line widths are obtained, the distortions and curvatures of field of the optical system to be measured OS are similarly obtained for these patterns. Thus, changes in imaging performance of the optical system to be measured OS for those patterns can be obtained.

In this embodiment, ±1st-order diffracted light beams are assumed to be generated by the first periodic pattern 312, and 0th- and +1st-order diffracted light beams are assumed to be generated by the second periodic pattern 316. Note that the position where at least one of two light beams diffracted by the second periodic pattern 316 is incident on the pupil plane of the optical system to be measured OS need only be different from those where two light beams diffracted by the first periodic pattern 312 are incident on the pupil plane of the optical system to be measured OS. For example, let $(p_{x11}, 0)$ and $(p_{x12}, 0)$ be the positions where two light beams diffracted by the first periodic pattern 312 are incident on the pupil plane of the optical system to be measured OS, and $(p_{x21}, 0)$ and $(P_{x22}, 0)$ be the positions where two light beams diffracted by the second periodic pattern 316 are incident on that pupil plane. Then, equations (9) are generalized to:

$$dX(X_i, Y_i) = \frac{\lambda}{NA \cdot (p_{x11} - p_{x12})} \times \quad (11)$$

$$\left[ \phi_{x1}(X_i, Y_i) - \frac{\left\{ \sqrt{1-(NA \cdot p_{x11})^2} - \sqrt{1-(NA \cdot p_{x12})^2} \right\} \left\{ \begin{array}{c} \phi_{x1}(X_i, Y_i) \cdot (p_{x21} - p_{x22}) - \\ \phi_{x2}(X_i, Y_i) \cdot (p_{x11} - p_{x12}) \end{array} \right\}}{(p_{x21} - p_{x22})\left\{ \sqrt{1-(NA \cdot p_{x11})^2} - \sqrt{1-(NA \cdot p_{x12})^2} \right\} - (p_{x11} - p_{x12})\left\{ \sqrt{1-(NA \cdot p_{x21})^2} - \sqrt{1-(NA \cdot p_{x22})^2} \right\}} \right]$$

$$dZ(X_i, Y_i) = \frac{\left(2\lambda \cdot \left\{ \begin{array}{c} \phi_{x1}(X_i, Y_i) \cdot (p_{x21} - p_{x22}) - \\ \phi_{x2}(X_i, Y_i) \cdot (p_{x11} - p_{x12}) \end{array} \right\} \right)}{(p_{x21} - p_{x22})\left\{ \sqrt{1-(NA \cdot p_{x11})^2} - \sqrt{1-(NA \cdot p_{x12})^2} \right\} + (p_{x11} - p_{x12})\left\{ \sqrt{1-(NA \cdot p_{x22})^2} - \sqrt{1-(NA \cdot p_{x21})^2} \right\}}$$

Equations (11) have solutions unless the positions where two light beams diffracted by the first periodic pattern 312 are incident on the pupil plane of the optical system to be measured OS are the same as those where two light beams diffracted by the second periodic pattern 316 are incident on that pupil plane ($p_{x21} = p_{x11}$, $p_{x22} = p_{x12}$). Hence, under a plurality of diffraction conditions which define different positions where diffracted light beams are incident on the pupil plane of the optical system to be measured OS, the curvatures of field of the optical system to be measured OS can be obtained based on the phase differences between the diffracted light beams, and the incident positions of the diffracted light beams.

In this manner, in this embodiment, under each of the first and second diffraction conditions, a change in intensity of light from the periodic patterns 310 is detected, and the phase difference between two light beams diffracted by the periodic patterns 310 is obtained for each of a plurality of image heights based on the change in intensity. The imaging performance including the curvature of field of the optical system to be measured OS is obtained based on the phase difference between two diffracted light beams and the positions, where the two diffracted light beams are incident on the pupil plane of the optical system to be measured OS, at each of a plurality of image heights under each of the first and second diffraction conditions. Hence, the measurement apparatus 1 can obtain not only the distortions of the optical system to be measured OS but also the curvatures of field of the optical system to be measured OS for all image heights at once. Note that in this embodiment, the first diffraction condition corresponds to the use of the first periodic patterns 312 and 314, and the second diffraction condition corresponds to the use of the second periodic patterns 316 and 318.

<Second Embodiment>

Figure 11:
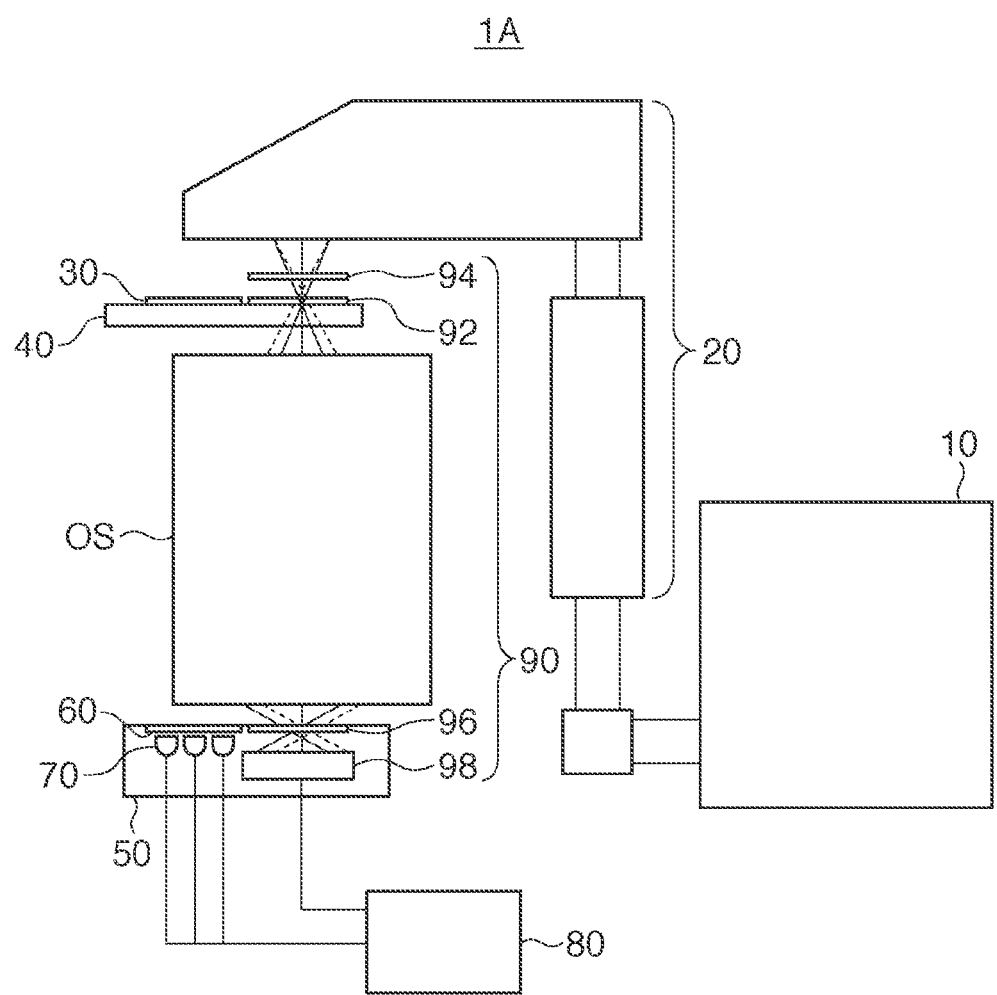
FIG. 11 is a diagram showing the configuration of a measurement apparatus according to the second embodiment of the present invention.

FIG. 11 is a diagram showing the configuration of a measurement apparatus 1A according to the second embodiment of the present invention. The measurement apparatus 1A has basically the same configuration as the measurement apparatus 1, but further includes a wavefront detection unit 90 which detects the wavefront of an optical system to be measured OS. The wavefront detection unit 90 includes a first wavefront measurement pattern 92, diffraction grating 94, second wavefront measurement pattern 96, and image sensing device 98.

Light emitted by a light source 10 has its spatial coherence reduced via an illumination optical system 20 including an incoherent unit, and illuminates the object plane of the optical system to be measured OS under an appropriate illumination condition (in an appropriate illumination mode).

The first wavefront measurement pattern 92 including a pinhole and aperture is placed on the object plane of the optical system to be measured OS. The diffraction grating 94 for splitting the light from the light source 10 is disposed above the first wavefront measurement pattern 92. The first wavefront measurement pattern 92, for example, is supported by a first stage 40 and can be disposed to be exchangeable for a first reference substrate 30. The diffraction grating 94 can be inserted/retracted into/from the space between the illumination optical system 20 and the object plane of the optical system to be measured OS by an insertion mechanism (not shown).

The first wavefront measurement pattern 92 and diffraction grating 94 are disposed such that diffracted light beams of two orders split by the diffraction grating 94 pass through the aperture and pinhole in the first wavefront measurement pattern 92, respectively. Because the pinhole has an opening diameter equal to or less than the diffraction limit of the optical system to be measured OS, the light having passed through the pinhole is shaped into an ideal spherical wave and enters the optical system to be measured OS.

The light having passed through the optical system to be measured OS reaches the image plane of the optical system to be measured OS. This light impinges on the second wavefront measurement pattern 96 placed on the image plane of the optical system to be measured OS. The second wavefront measurement pattern 96 including the pinhole and aperture is positioned on the image plane of the optical system to be measured OS. Also, the image sensing device 98 including, for example, a CCD is disposed below the second wavefront measurement pattern 96. The second wavefront measurement pattern 96 and image sensing device 98 are supported by a second stage 50 and disposed to be exchangeable for a second reference substrate 60 and a detection unit 70.

Light (to be referred to as "reference light" hereinafter) having passed through the aperture of the first wavefront measurement pattern 92 passes through the pinhole of the second wavefront measurement pattern 96. On the other hand, light (to be referred to as "test light" hereinafter) having passed through the pinhole of the first wavefront measurement pattern 92 passes through the aperture of the second wavefront measurement pattern 96.

Because the pinhole of the second wavefront measurement pattern 96 has an opening diameter equal to or less than the diffraction limit of the optical system to be measured OS, the reference light having passed through the pinhole is shaped into an ideal spherical wave. Also, because the aperture of the second wavefront measurement pattern 96 has an opening diameter sufficiently larger than the point image intensity distribution of the optical system to be measured OS, the test light can pass through the aperture of the second wavefront measurement pattern 96 while keeping the aberration information of the optical system to be measured OS intact. Therefore, the test light is shaped into an ideal spherical shape before it enters the optical system to be measured OS, and passes through the aperture of the second wavefront measurement pattern 96 while keeping the aberration information of the optical system to be measured OS intact even after passing through the optical system to be measured OS, so the wavefront of the test light becomes equal to the wavefront aberration of the optical system to be measured OS.

The image sensing device 98 senses interference fringes (an interference pattern) formed between the reference light and the test light transmitted through the second wavefront measurement pattern 96. Because the reference light and the test light have different image point positions, tilted fringes are generated in the interference fringes sensed by the image sensing device 98. The interference fringes sensed by the image sensing device 98 are input to a processing unit 80. The processing unit 80 detects the wavefront (wavefront aberration) of the optical system to be measured OS using, for example, the electronic moiré method or the FFT method by means of the tilted fringes generated in the interference fringes. Since the first stage 40 and the second stage 50 can drive the first wavefront measurement pattern 92 and the second wavefront measurement pattern 96, respectively, within the effective field of the optical system to be measured OS, the processing unit 80 can detect the wavefront of the optical system to be measured OS at an arbitrary image height.

Since the measurement apparatus 1A also includes the first reference substrate 30, second reference substrate 60, and detection unit 70, it can also measure the distortion and curvature of field of the optical system to be measured OS, like the measurement apparatus 1.

In this embodiment, the processing unit 80 performs a process for obtaining the wavefront aberration, including the distortion and curvature of field, of the optical system to be measured OS as the imaging performance of the optical system to be measured OS.

Measurement of the imaging performance (the wavefront aberration including the distortion and curvature of field) of the optical system to be measured OS by the measurement apparatus 1A will be described below with reference to FIG. 12. This measurement is performed by systematically controlling each unit of the measurement apparatus 1A by the processing unit 80.

In step S202, the processing unit 80 obtains the wavefront of the optical system to be measured OS, which is detected by the wavefront detection unit 90, using the first wavefront measurement pattern 92 and second wavefront measurement pattern 96, as described earlier. The wavefront of the optical system to be measured OS is obtained (detected) for each of a plurality of image heights $(X_i, Y_i)$. The tilt and defocus of the wavefront of the optical system to be measured OS, which is detected by the wavefront detection unit 90, are nonconstant and therefore must be removed. More specifically, tilt and defocus components with which the RMS of the wavefront detected by the wavefront detection unit 90 minimizes are removed from this wavefront. As a result, a first wavefront $W_{meas}(S_x, S_y; X_i, Y_i)$ obtained by removing the tilt and defocus components from the wavefront detected by the wavefront detection unit 90 is obtained for each of a plurality of image heights.

In step S204, it is determined whether first wavefronts $W_{meas}(S_x, S_y; X_i, Y_i)$ have been obtained for all of the plurality of image heights $(X_i, Y_i)$. If the first wavefronts $W_{meas}(S_x, S_y; X_i, Y_i)$ have not yet been obtained for all of the plurality of image heights $(X_i, Y_i)$, the process returns to step S202 to obtain a first wavefront at the next image height. On the other hand, if the first wavefronts $W_{meas}(S_x, S_y; X_i, Y_i)$ have been obtained for all of the plurality of image heights $(X_i, Y_i)$, the process advances to step S206.

Figure 12:
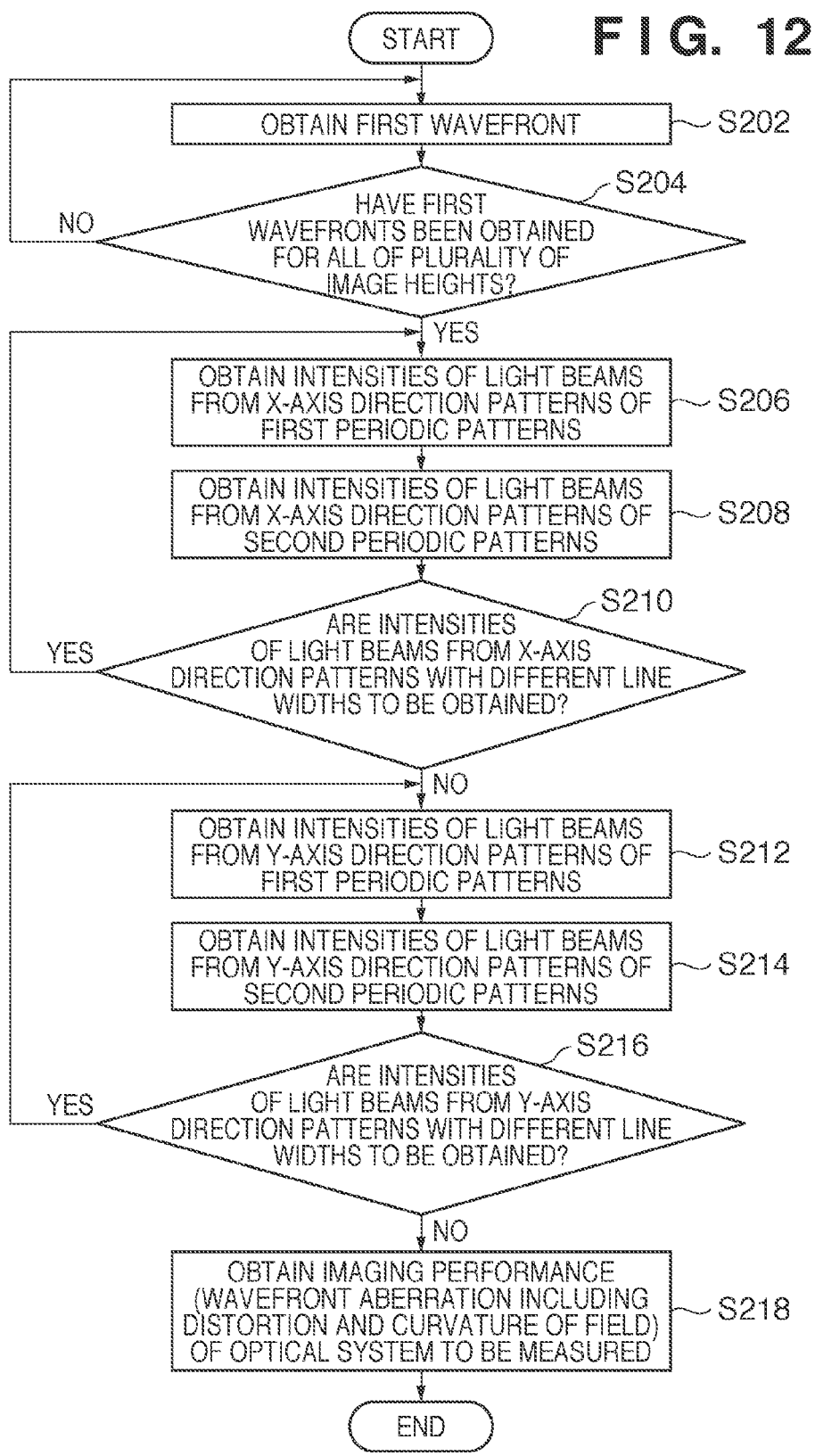
FIG. 12 is a flowchart for explaining measurement of the imaging performance (the wavefront aberration including the distortion and curvature of field) of an optical system to be measured by the measurement apparatus shown in FIG. 11.

Steps S206 to S216 shown in FIG. 12 are the same as in steps S102 to S112, respectively, and a detailed description thereof will not be given. In steps S206 to S216, phases $\phi_{x1}(X_i, Y_i)$, $\phi_{x2}(X_i, Y_i)$, $\phi_{y1}(X_i, Y_i)$, and $\phi_{y2}(X_i, Y_i)$ are obtained for each of the plurality of image heights $(X_i, Y_i)$.

In step S218, the processing unit 80 obtains the wavefront aberration, including the distortion and curvature of field, of the optical system to be measured OS as the imaging performance of the optical system to be measured OS. A wavefront aberration $W_{all}$ including tilt and defocus components is the sum of the first wavefront $W_{meas}$, a tilted wavefront $W_{tilt}$, and a defocused wavefront $W_{def}$:

$$W_{all}(s_x, s_y; X_i, Y_i) = \qquad (12)$$

$$W_{meas}(s_x, s_y; X_i, Y_i) + W_{tilt}(s_x, s_y; X_i, Y_i) + W_{def}(s_x, s_y; X_i, Y_i) =$$

$$W_{meas}(s_x, s_y; X_i, Y_i) + dX(X_i, Y_i)\frac{NA \cdot s_x}{\lambda} +$$

$$dY(X_i, Y_i)\frac{NA \cdot s_y}{\lambda} + dZ(X_i, Y_i)\frac{1 - \sqrt{1 - NA^2(s_x^2 + s_y^2)}}{2\lambda}$$

Phases (phase differences) $\phi'_{x1}(X_i,Y_i)$, $\phi'_{x2}(X_i,Y_i)$, $\phi'_{y1}(X_i,Y_i)$, and $\phi'_{y2}(X_i,Y_i)$ obtained by correcting the phases $\phi_{x1}(X_i,Y_i)$, $\phi_{x2}(X_i,Y_i)$, $\phi_{y1}(X_i,Y_i)$, and $\phi_{y2}(X_i,Y_i)$, respectively, using the first wavefront $W_{meas}$ are defined as:

$$\begin{cases} \phi'_{x1}(X_i, Y_i) = \phi_{x1}(X_i, Y_i) - \{W_{meas}(P_{x11}) - W_{meas}(P_{x12})\} \\ \phi'_{x2}(X_i, Y_i) = \phi_{x2}(X_i, Y_i) - \{W_{meas}(P_{x21}) - W_{meas}(P_{x22})\} \\ \phi'_{y1}(X_i, Y_i) = \phi_{y1}(X_i, Y_i) - \{W_{meas}(P_{y11}) - W_{meas}(P_{y12})\} \\ \phi'_{y2}(X_i, Y_i) = \phi_{y2}(X_i, Y_i) - \{W_{meas}(P_{y21}) - W_{meas}(P_{y22})\} \end{cases} \qquad (13)$$

Assume that the positions where two light beams diffracted by a first periodic pattern 312 are incident on the pupil plane of the optical system to be measured OS, and those where two light beams diffracted by a second periodic pattern 316 are incident on that pupil plane are the same as in the first embodiment. In this case, from equations (12) and (13), the tilt (dX, dY) and the defocus (dZ) are given by:

$$\begin{cases} dX(X_i, Y_i) = \frac{\phi'_{x1}(X_i, Y_i)}{2}\frac{\lambda}{NA \cdot p} \\ dY(X_i, Y_i) = \frac{\phi'_{y1}(X_i, Y_i)}{2}\frac{\lambda}{NA \cdot p} \\ dZ(X_i, Y_i) = (\phi'_{x1}(X_i, Y_i) - 2\phi'_{x2}(X_i, Y_i))\frac{\lambda}{1 - \sqrt{1 - (NA \cdot p)^2}} \end{cases} \qquad (14)$$

Therefore, the wavefront aberration, including the distortion and curvature of field, of the optical system to be measured OS is given by:

$$W_{all}(sx, sy; Xi, Yi) = \qquad (15)$$

$$W_{meas}(s_x, s_y; Xi, Yi) + \frac{\phi'_{x1}(X_i, Y_i)}{2}\frac{sx}{P} + \frac{\phi'_{y1}(X_i, Y_i)}{2}\frac{s_y}{P} +$$

$$\frac{(\phi'_{x1}(X_i, Y_i) - 2\phi'_{x2}(X_i, Y_i))}{2}\frac{1 - \sqrt{1 - NA^2(s_x^2 + s_y^2)}}{1 - \sqrt{1 - (NA \cdot P)^2}}$$

The wavefront aberrations, including the distortions and curvatures of field, of the optical system to be measured OS are obtained for all image heights.

In this manner, in this embodiment, a first wavefront is obtained by removing tilt and defocus components, with which the RMS of the wavefront detected by the wavefront detection unit 90 minimizes, from this wavefront (first process). Also, the phase difference of the first wavefront between the positions where two light beams diffracted by a periodic patterns 310 are incident on the pupil plane of the optical system to be measured OS is obtained for each of the first and second diffraction conditions (second process). Moreover, tilt and defocus components with which the phase difference of the first wavefront matches that between two light beams diffracted by the periodic patterns 310 are obtained for each of the first and second diffraction conditions (third process). Lastly, the wavefront aberration, including the distortion and curvature of field, of the optical system to be measured OS is obtained by adding the tilt and defocus components to the first wavefront (fourth process).

Using the wavefront aberration, including the distortion and curvature of field, of the optical system to be measured OS, the imaging performance, including the distortion and curvature of field, of the optical system to be measured OS can be obtained for an arbitrary pattern and illumination condition. This makes it possible to more precisely evaluate the optical system to be measured OS.

<Third Embodiment>

Figure 13:
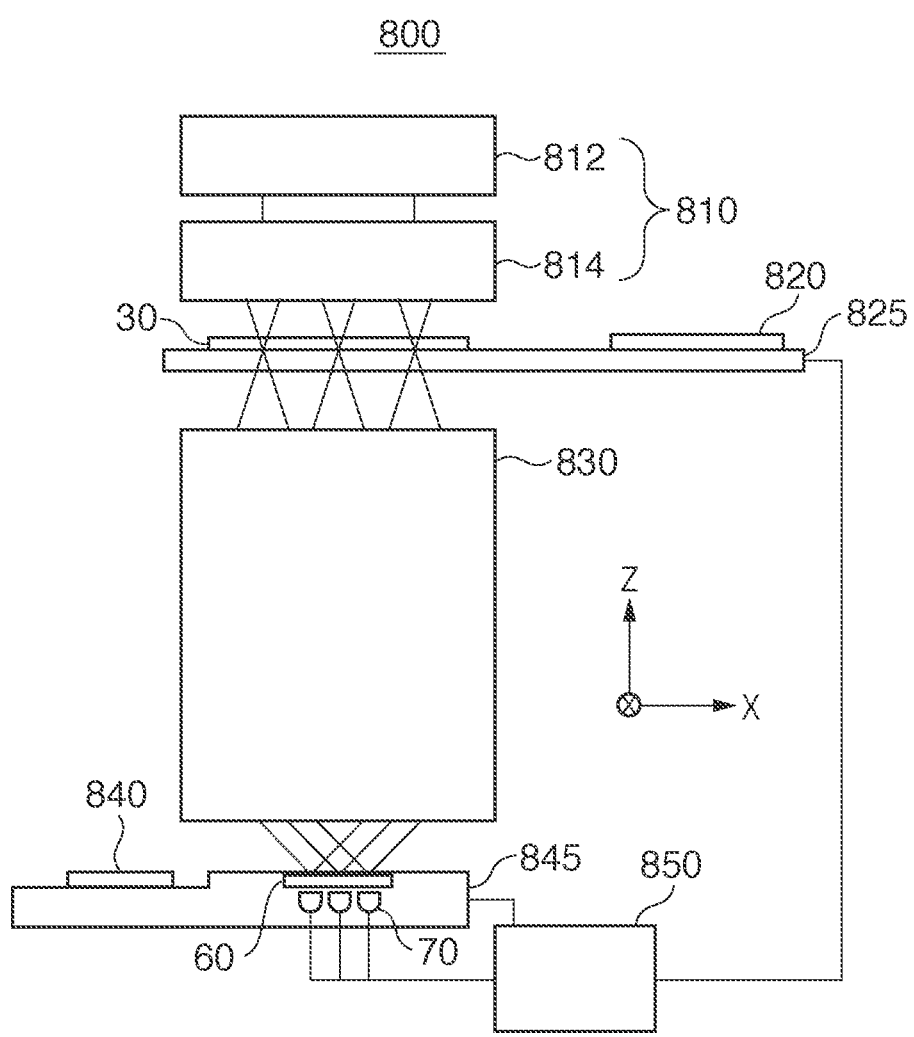
FIG. 13 is a schematic diagram showing the configuration of an exposure apparatus according to the third embodiment of the present invention.

FIG. 13 is a schematic diagram showing the configuration of an exposure apparatus 800 according to the third embodiment of the present invention. The exposure apparatus 800 is, for example, a scanning exposure apparatus (scanner) which transfers the pattern of a reticle 820 onto a wafer 840 by the step & scan scheme. The exposure apparatus 800 includes an illumination apparatus 810, a reticle stage 825 which supports the reticle 820 and a first reference substrate 30, a projection optical system 830, a wafer stage 845 which supports the wafer 840, a second reference substrate 60, and a detection unit 70, and a control unit 850. Although a measurement apparatus 1 is applied to the exposure apparatus 800, as will be described later, a measurement apparatus 1A is also applicable to the exposure apparatus 800, as a matter of course.

The illumination apparatus 810 illuminates the reticle 820 on which a circuit pattern to be transferred is formed, and the first reference substrate 30, and includes a light source 812 and illumination optical system 814.

An excimer laser, for example, is used as the light source 812. The excimer laser used includes, for example, a KrF excimer laser with a wavelength of about 248 nm and an ArF excimer laser with a wavelength of about 193 nm. However, the light source 812 is not limited to an excimer laser, and may be, for example, the i-line of mercury with a wavelength of about 365 nm.

The illumination optical system 814 illuminates the reticle 820 and first reference substrate 30, and includes, for example, a lens, mirror, optical integrator, phase plate, diffraction optical element, and stop.

The reticle 820 has a circuit pattern, and is supported and driven by the reticle stage 825. Light diffracted by the reticle 820 is projected onto the wafer 840 via the projection optical system 830. Since the exposure apparatus 800 is a scanner, it transfers the pattern of the reticle 820 onto the wafer 840 by scanning the reticle 820 and wafer 840.

The reticle stage 825 supports the reticle 820 and first reference substrate 30, and drives them using, for example, a linear motor.

The projection optical system 830 projects the pattern of the reticle 820 onto the wafer 840. A dioptric system, a catadioptric system, or a catoptric system can be used as the projection optical system 830.

The wafer 840 is a substrate onto which the pattern of the reticle 820 is projected (transferred), and is supported and driven by the wafer stage 845. However, a glass plate or another substrate can also be used in place of the wafer 840.

The wafer stage 845 supports the wafer 840, second reference substrate 60, and detection unit 70, and drives them using, for example, a linear motor.

The control unit 850 includes a CPU and memory, and controls the operation of the exposure apparatus 800. In this embodiment, the control unit 850 also performs a process for obtaining the imaging performances (for example, the distortion and curvature of field) of the projection optical system 830. The control unit 850 adjusts each unit of the exposure apparatus 800 including the projection optical system 830, based on the obtained imaging performances of the projection optical system 830.

In the exposure apparatus 800, the illumination apparatus 810, reticle stage 825, wafer stage 845, and control unit 850 function as the light source 10, illumination optical system 20, first stage 40, second stage 50, and processing unit 80, respectively, mentioned above. Hence, the illumination apparatus 810, first reference substrate 30, reticle stage 825, second reference substrate 60, detection unit 70, wafer stage 845, and control unit 850 constitute the measurement apparatus 1, and measure the imaging performances of the projection optical system 830 as an optical system to be measured.

In the operation of the exposure apparatus 800, first, the imaging performances of the projection optical system 830 are measured. The first reference substrate 30, reticle stage 825, second reference substrate 60, detection unit 70, wafer stage 845, and control unit 850 which constitute the measurement apparatus 1 measure the imaging performances of the projection optical system 830, as described above. After the imaging performances of the projection optical system 830 are measured, each unit of the exposure apparatus 800 including the projection optical system 830 is adjusted so as to attain predetermined imaging performances.

Next, the pattern of the reticle 820 is transferred onto the wafer 840. The first reference substrate 30 and second reference substrate 60 which are placed on the object plane and image plane, respectively, of the projection optical system 830 are exchanged for the reticle 820 and wafer 840 by the reticle stage 825 and wafer stage 845, respectively. A light beam emitted by the light source 812 illuminates the reticle 820 by the illumination optical system 814. The light which bears the information of the pattern of the reticle 820 forms an image on the wafer 840 by the projection optical system 830. At this time, the imaging performances of the projection optical system 830 have been adjusted so as to attain predetermined imaging performances. Hence, the exposure apparatus 800 can provide high-quality devices (for example, a semiconductor device, an LCD device, an image sensing device (for example, a CCD), and a thin film magnetic head) with a high throughput and good economical efficiency. These devices are fabricated by a step of exposing a substrate (for example, a wafer or a glass plate) coated with a photoresist (photosensitive agent) using the exposure apparatus 800, a step of developing the exposed substrate, and subsequent known steps.

Although the second reference substrate is driven in a direction perpendicular to the optical axis of the optical system to be measured to detect the intensities of light beams from the first reference substrate in this embodiment, the first reference substrate may be driven while the second reference substrate is fixed in position.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-279812 filed on Dec. 9, 2009, which is hereby incorporated by reference herein in its entirety.

What is claimed is:

1. A measurement apparatus which measures an imaging performance of an optical system to be measured, the apparatus comprising:

a first reference substrate which is placed on an object plane of the optical system to be measured, and has periodic patterns arranged in accordance with a plurality of object heights;

a second reference substrate which is placed on an image plane of the optical system to be measured, and has apertures which pass light from the periodic patterns;

a detection unit configured to detect an intensity of the light which comes from the periodic patterns and has passed through the apertures;

a driving unit configured to drive at least one of said first reference substrate or said second reference substrate; and a processing unit configured to perform a process for obtaining the imaging performance of the optical system to be measured, wherein said processing unit obtains, for each of a plurality of image heights corresponding to the plurality of object heights, a phase difference between two light beams, which are diffracted by the periodic pattern and pass through two positions on a pupil plane of the optical system to be measured, from a change in the intensity of the light from the periodic patterns, which is detected by said detection unit upon driving at least one of said first reference substrate or said second reference substrate in a direction perpendicular to an optical axis of the optical system to be measured by said driving unit, under a first diffraction condition in which the two diffracted light beams are generated, obtains, for each of the plurality of image heights corresponding to the plurality of object heights, a phase difference between two light beams, which are diffracted by the periodic pattern and pass through two positions on the pupil plane, from a change in the intensity of the light from the periodic patterns, which is detected by said detection unit upon driving at least one of said first reference substrate or said second reference substrate in the direction perpendicular to the optical axis by said driving unit, under a second diffraction condition in which the two diffracted light beams are generated and a position where at least one of the two diffracted light beams is incident on the pupil plane is different from positions where the two light beams diffracted by the periodic pattern are incident on the pupil plane under the first diffraction condition, and obtains an imaging performance, including a curvature of field, of the optical system to be measured, based on the phase difference between the two diffracted light beams and the positions where the two diffracted light beams are incident on the pupil plane at each of the plurality of image heights under the first diffraction condition, and the phase difference between the two diffracted light beams and the positions where the two diffracted light beams are incident on the pupil plane at each of the plurality of image heights under the second diffraction condition.

2. The apparatus according to according to claim 1, wherein said processing unit further obtains a distortion of the optical system to be measured as the imaging performance of the optical system to be measured, based on the phase difference between the two diffracted light beams and the positions where the two diffracted light beams are incident on the pupil plane at each of the plurality of image heights under the first diffraction condition, and the phase difference between the two diffracted light beams and the positions where the two diffracted light beams are incident on the pupil plane at each of the plurality of image heights under the second diffraction condition.

3. The apparatus according to claim 1, further comprising:
a wavefront detection unit configured to detect a wavefront of the optical system to be measured,
wherein said processing unit performs:
a first process of obtaining a first wavefront by removing a tilt component and a defocus component, with which an RMS of the wavefront detected by said wavefront detection unit minimizes, from the wavefront,
a second process of obtaining a phase difference of the first wavefront between the positions, where the two diffracted light beams are incident on the pupil plane, for each of the first diffraction condition and the second diffraction condition,
a third process of obtaining a tilt component and a defocus component, with which the phase difference of the first wavefront obtained in the second process matches the phase difference between the two diffracted light beams, for each of the first diffraction condition and the second diffraction condition, and
a fourth process of obtaining a wavefront aberration, including a distortion and a curvature of field, of the optical system to be measured by adding the tilt component and the defocus component which are obtained in the third process to the first wavefront obtained in the first process.

4. The apparatus according to claim 1, wherein the aperture has dimensions smaller than dimensions of an image obtained by projecting the periodic pattern onto the image plane of the optical system to be measured.

5. The apparatus according to claim 1, wherein
the periodic pattern includes a first periodic pattern used under the first diffraction condition, and a second periodic pattern used under the second diffraction condition,
the first periodic pattern is of a phase type with a constant amplitude transmittance and a phase of one of 0 or $\pi$, and
the second periodic pattern is of a phase-amplitude modulation type with an amplitude transmittance which takes binary values and a phase which changes between 0 to $\pi$ for each half period of a change in amplitude transmittance.

6. An exposure apparatus comprising:
a projection optical system configured to project a pattern of a reticle onto a substrate; and
a measurement apparatus configured to measure an imaging performance of said projection optical system as an optical system to be measured,
wherein said measurement apparatus comprises a measurement apparatus defined in claim 1.

7. A device fabrication method comprising steps of:
exposing a substrate using an exposure apparatus; and
performing a development process for the substrate exposed,
wherein the exposure apparatus includes:
a projection optical system configured to project a pattern of a reticle onto the substrate; and
a measurement apparatus configured to measure an imaging performance of the projection optical system, and
wherein the measurement apparatus includes:
a first reference substrate which is placed on an object plane of the projection optical system, and has periodic patterns arranged in accordance with a plurality of object heights;
a second reference substrate which is placed on an image plane of the projection optical system, and has apertures which pass light from the periodic patterns;
a detection unit configured to detect an intensity of the light which comes from the periodic patterns and has passed through the apertures;
a driving unit configured to drive at least one of the first reference substrate or the second reference substrate; and
a processing unit configured to perform a process for obtaining the imaging performance of the projection optical system, and
wherein the processing unit:
obtains, for each of a plurality of image heights corresponding to the plurality of object heights, a phase difference between two light beams, which are diffracted by the periodic pattern and pass through two positions on a pupil plane of the projection optical system, from a change in the intensity of the light from the periodic patterns, which is detected by the detection unit upon driving at least one of the first reference substrate or the second reference substrate in a direction perpendicular to an optical axis of the projection optical system by the driving unit, under a first diffraction condition in which the two diffracted light beams are generated,
obtains, for each of the plurality of image heights corresponding to the plurality of object heights, a phase difference between two light beams, which are diffracted by the periodic pattern and pass through two positions on the pupil plane, from a change in the intensity of the light from the periodic patterns, which is detected by the detection unit upon driving at least one of the first reference substrate or the second reference substrate in the direction perpendicular to the optical axis by the driving unit, under a second diffraction condition in which the two diffracted light beams are generated and a position where at least one of the two diffracted light beams is incident on the pupil plane is different from positions where the two light beams diffracted by the periodic pattern are incident on the pupil plane under the first diffraction condition, and
obtains an imaging performance, including a curvature of field, of the projection optical system, based on the phase difference between the two diffracted light beams and the positions where the two diffracted light beams are incident on the pupil plane at each of the plurality of image heights under the first diffraction condition, and the phase difference between the two diffracted light beams and the positions where the two diffracted light beams are incident on the pupil plane at each of the plurality of image heights under the second diffraction condition.

* * * * *